(12) United States Patent
Hsu et al.

(10) Patent No.: US 11,656,552 B2
(45) Date of Patent: *May 23, 2023

(54) DEVICE HAVING COLOR RESISTS PATTERN AND METHOD FOR MANUFACTURING THE SAME

(71) Applicants: Ming-An Hsu, Hsinchu (TW); Wen-Fu Lin, Toufen Township, Miaoli County (TW)

(72) Inventors: Ming-An Hsu, Hsinchu (TW); Wen-Fu Lin, Toufen Township, Miaoli County (TW)

( * ) Notice: Subject to any disclaimer, the term of this patent is extended or adjusted under 35 U.S.C. 154(b) by 400 days.

This patent is subject to a terminal disclaimer.

(21) Appl. No.: 15/211,643

(22) Filed: Jul. 15, 2016

(65) Prior Publication Data

US 2017/0017159 A1    Jan. 19, 2017

(30) Foreign Application Priority Data

Jul. 16, 2015   (TW) .................................. 104123105
Jul. 16, 2015   (TW) .................................. 104211480

(51) Int. Cl.
*G03F 7/40* (2006.01)
*G03F 7/16* (2006.01)
*G03F 7/105* (2006.01)
*G03F 7/095* (2006.01)

(52) U.S. Cl.
CPC ................ *G03F 7/40* (2013.01); *G03F 7/095* (2013.01); *G03F 7/105* (2013.01); *G03F 7/168* (2013.01)

(58) Field of Classification Search
CPC .......... G03F 7/095; G03F 7/105; G03F 7/168; G03F 7/40
See application file for complete search history.

(56) References Cited

U.S. PATENT DOCUMENTS

| 10,955,748 | B2* | 3/2021 | Hsu | ........................... G03F 7/16 |
| 2004/0125301 | A1* | 7/2004 | Lee | ................... G02F 1/134363 349/141 |
| 2006/0152648 | A1* | 7/2006 | Kim | ................... G02F 1/133308 349/58 |
| 2008/0227507 | A1* | 9/2008 | Joo | ..................... H04M 1/0266 455/575.8 |

(Continued)

FOREIGN PATENT DOCUMENTS

CN            103129073 A    *    6/2013

OTHER PUBLICATIONS

Machine Translation of Cn 103129073A (Year: 2013).*

*Primary Examiner* — Christopher M Polley
*Assistant Examiner* — Sathavaram I Reddy
(74) *Attorney, Agent, or Firm* — Muncy, Geissler, Olds & Lowe, P.C.

(57) ABSTRACT

A device having color resists pattern and method for manufacturing are disclosed. The device includes a substrate, at least two color resist layers. The at least color resist layers are formed on the curved and construct a visible pattern, wherein at a boundary of the color resist pattern, the at least two color resist layers form a ramp structure and each of the at least two color resist layers contacts the substrate; and the ramp structure is formed in sequential order by one exposure process, one removal process and one baking process of the at least two color resist layers.

6 Claims, 7 Drawing Sheets

(56) References Cited

U.S. PATENT DOCUMENTS

| | | | | |
|---|---|---|---|---|
| 2012/0050173 A1* | 3/2012 | Chou | ............... | G06F 3/044 345/173 |
| 2013/0082961 A1* | 4/2013 | Wang | ............... | G06F 3/044 345/173 |
| 2013/0153393 A1* | 6/2013 | Omote | ............... | G06F 3/044 200/600 |
| 2014/0043776 A1* | 2/2014 | Yang | ............... | G06F 3/0445 361/749 |

* cited by examiner

DEVICE HAVING COLOR RESISTS PATTERN AND METHOD FOR MANUFACTURING THE SAME

BACKGROUND OF THE INVENTION

1. Field of the Invention

The present disclosure relates to color resist, more particularly to a device having color resist pattern and method for manufacturing the same.

2. Description of the Related Art

Currently, smart devices including smartphones, smart watches and intelligent medical apparatus, are provided with large screens to facilitate users to view information shown on the screens. Among from large screens and strong functions, shape designs of these devices have increasing trend to personalized and beautiful performances in appearance, shape and color, and the desired improvement can be realized by a fantastic outer shell design and production. The outer shell with curved surface is particularly attractive and gradually becomes future trend of the smart device.

The way for manufacturing the pattern on the outer shell with the curved surface of the smart device can be divided into several manners. The first manner is transfer printing technology. A planar pattern is prepared in advance and then printed on the curved surface of the target by manner of transfer printing. The first manner has an advantage of low cost in production process, but disadvantages of slow process speed, high cost in material, and poor resolution of circuit. The second manner is inkjet plus laser engraving technologies. Dyestuff is sprayed on the curved surface of the target by manner of inkjet, and the laser engraving is performed to engrave the pattern. The second manner has disadvantages of high cost in production process, processing apparatus and material, and slow process speed, but has an advantage of high resolution of circuit up to 20 um (micron).

The technology for manufacturing the outer shell with curved surface can also be applied in planar outer shell. However, there is other technology for manufacturing the pattern of the planar outer shell, for example, screen printing technology. However, the screen printing technology just realizes low resolution of circuit.

Therefore, how to develop the method for manufacturing color pattern on the planar outer shell, curved outer shell, three-dimensional outer shell of the smart device with advantages of low cost in production process and material, high process speed and high resolution of circuit.

SUMMARY OF THE INVENTION

In order to achieve aforesaid objective, the present disclosure is to provide a device having color resist pattern and method for manufacturing the same, and the device and method have advantages of low cost in process and material, fast process speed, and high resolution of circuit, so as to solve the conventional technical problems of speed process speed, high cost in material and poor resolution of circuit.

The present disclosure provides a device having color resist pattern, and the device includes a substrate and at least two color resist layers formed on the substrate. The at least two color resist layers construct a visible pattern together.

The present disclosure further provides a method for manufacturing a color resist pattern, and the method includes steps of: in sequential order, forming at least two color resist layers which construct a color resist composite layer, on a substrate; performing an exposure process on the color resist composite layer, by a mask which has a predetermined pattern; removing a part of the color resist composite layer other than the pattern, so as to form the color resist pattern; and curing the color resist composite layer.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these teens. The terms are used only for the purpose of distinguishing one component from another component. Thus, a first element discussed below could be termed a second element without departing from the teachings of embodiments. As used herein, the term "or" includes any and all combinations of one or more of the associated listed items.

According to the embodiment of the present disclosure, the present disclosure provides a device having color resists and method for manufacturing method the same. In the embodiment, by manner of forming multiple layers of color resist first and performing the exposure process, the pattern can be manufactured on planar or curved shell body with advantages of high-resolution, low cost and production capacity.

Please refer to FIGS. 1A, and 3A-3G which respectively show flowcharts of an embodiment of the method for manufacturing color resist pattern of the present disclosure. The method can be applied to manufacture a cell-phone substrate shown in FIG. 2, and includes main steps below.

Figure 1A:
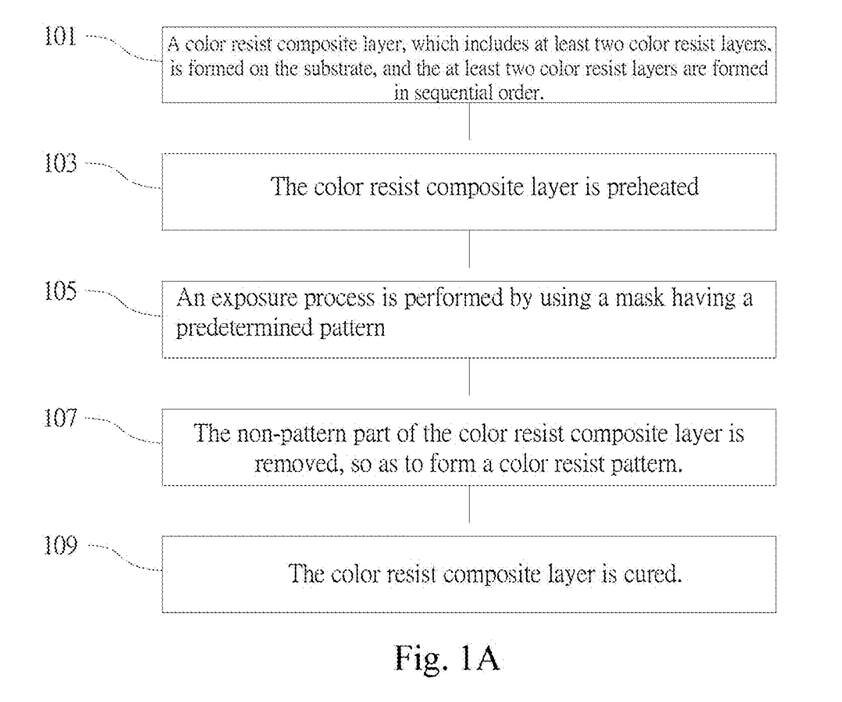
FIG. 1A is a flowchart of an embodiment of method for manufacturing color resist pattern of the present disclosure.

In a step 101, a color resist composite layer, which includes at least two color resist layers, is formed on the substrate, and the at least two color resist layers are formed in sequential order. The color resist composite layer can be formed by a spraying manner, so as to enable the each of color resist layers to have better uniformity. The present disclosure is not limited to the spraying manner, and the manners of inkjet, transfer printing, and screen printing and so on can also be applied to form the color resist composite layer. Preferably, the substrate can be planar substrate, curved substrate or 3D substrate. Furthermore, the substrate can be glass substrate, plastic substrate, or ceramic substrate.

Figure 2:
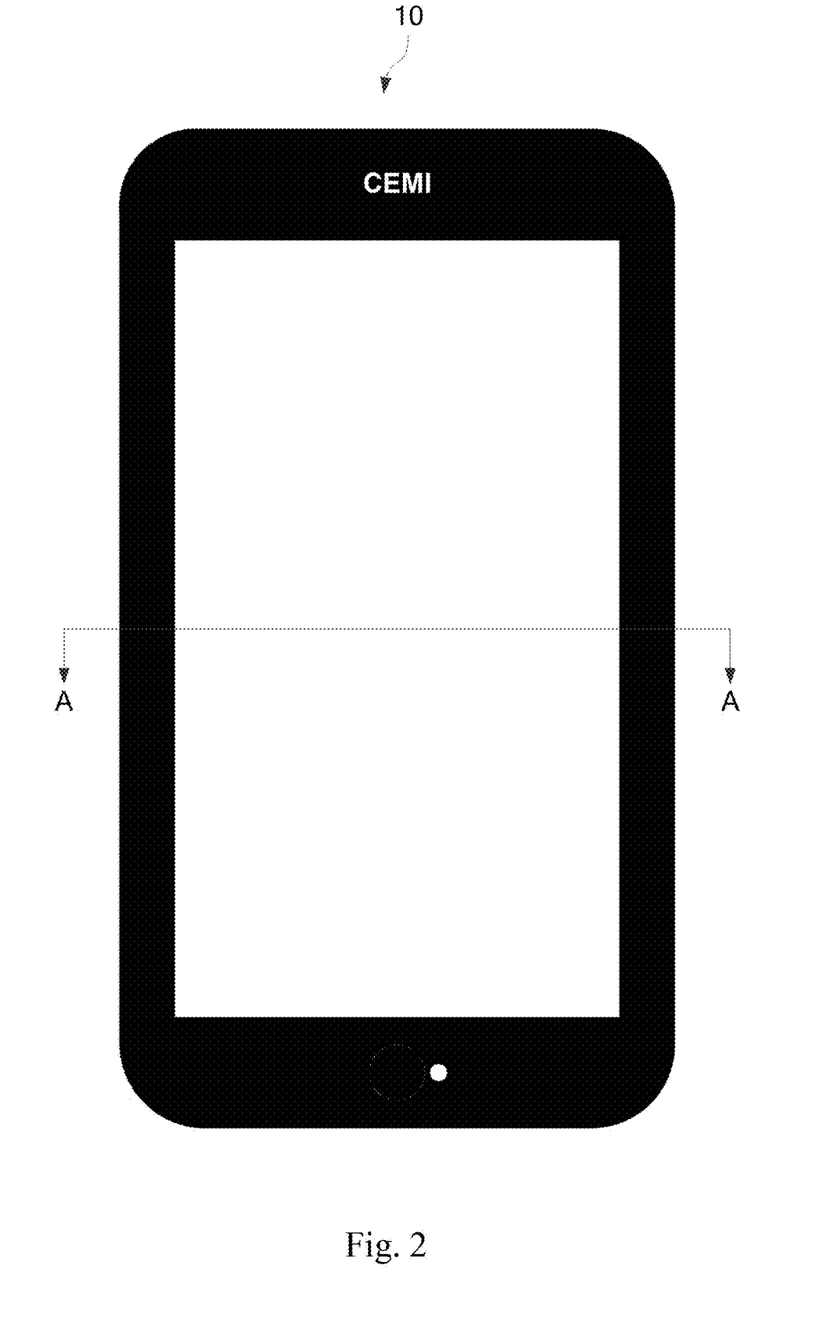
FIG. 2 is a top view of cell-phone substrate manufactured by the method of forming the color resist pattern, in accordance with of the present disclosure.

The embodiment shown in FIGS. 3A to 3G, which are sectional views taken along line A-A of FIG. 2, is taken as an example for explaining the steps of the method for manufacturing the pattern of the cell-phone substrate 10 of FIG. 2. Particularly, in the embodiment, the method for manufacturing the color resist pattern on the curved substrate is described with explanation of special technology of applying the composite resist layer including multiple resist layers and applying the exposure process. The colors of color resists can be fitted with each other upon demand, for example, when the pattern is desired to be presented in white color, the first color resist layer can be white, the second color resist layer can be gray or black, and the third color resist layer (the topmost layer) is transparent; when the pattern is desired to be presented in black color, the first color resist layer can be black and the second color resist layer can be transparent. The topmost color resist layer can be transparent to prevent the substrate from being scratched and improve protection.

In other words, the color resists of the present disclosure mean the color resists with various colors, such as white, red, orange, yellow, green, blue, indigo, purple, black, or transparent (colorless). The operator can select the color from the color series with which the color resist can be formed. The colors with various color tones can be created by multiple color layers. In addition, the photoresist material can be positive photoresist or negative photoresist, to achieve the desired technical effect of the present disclosure. Each of the color resist layers has a thickness ranged from 0.5 micron to 30 micron.

Figure 3A:
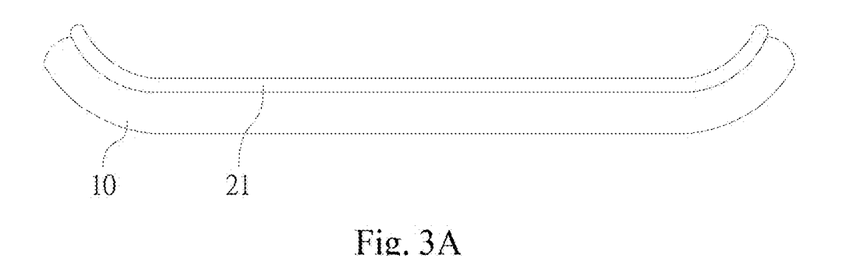
FIGS. 3A to 3G are schematic views of flows of a particular embodiment of the method for manufacturing the color resist pattern of the present disclosure.
Figure 3B:
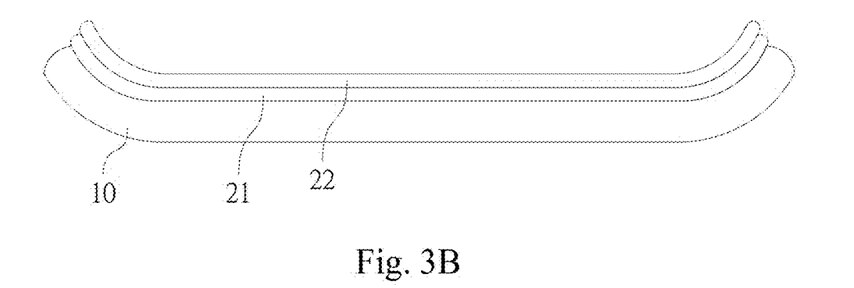
Figure 3C:
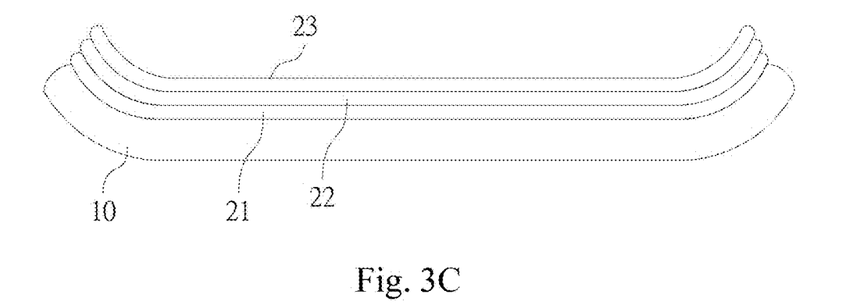

Please refer to FIGS. 3A to 3C which respectively show steps of forming the color resist composite layer, in the method of the method for manufacturing color resist pattern, in accordance with the present disclosure. In the embodiment, a color resist composite layer including three layers, is formed. Three color resist layers 21, 22 and 23 are respectively formed on the substrate 10, and the color resist layer 23 is the topmost layer and can be implemented by transparent color resist.

In s step 103, the color resist composite layer is preheated. The preheating procedure can remove the solvent remained in the photoresist, so as to reduce the flowability and improve uniformity of the color resist composite layer without being deformed easily. The preheating process is performed under a temperature ranged from 70° C. to 120° C., and the temperature and time for reheating can be adjusted upon property of the material.

In a step 105, an exposure process is performed by using a mask having a predetermined pattern. The pattern of the mask is the pattern desired to be formed on the substrate, such as an annular rectangular frame pattern of the screen for the smart device. When the substrate is a curved surface, the pattern is an annular rectangular curved surface. This kind of pattern has a linewidth larger than 10 microns; in other words, a resolution up to 10 micron.

Figure 3D:
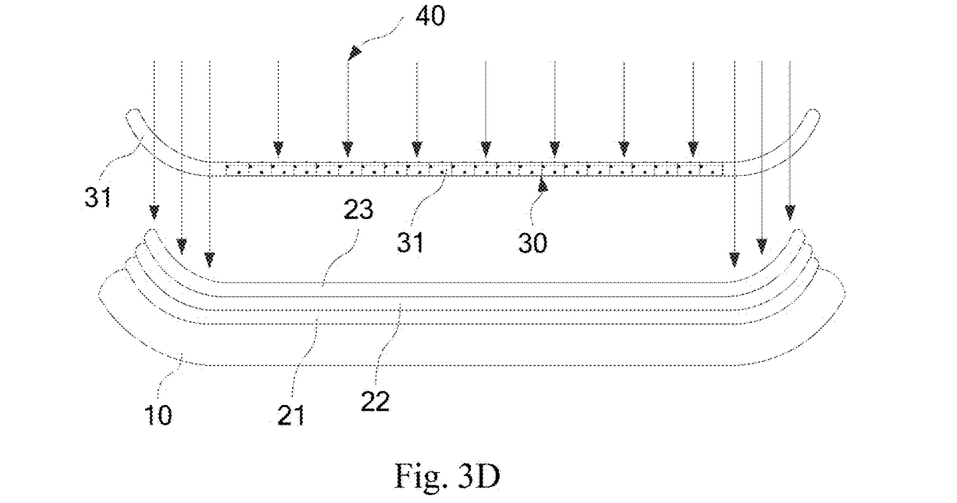
Figure 3E:
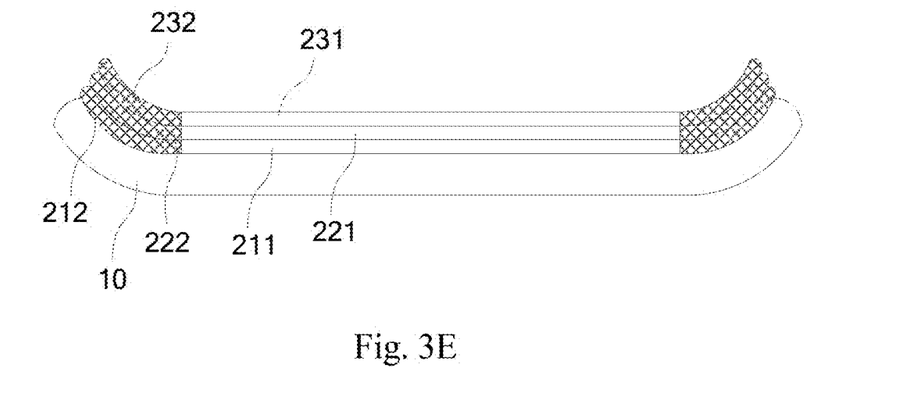

Please refer to FIGS. 3D to 3E. In this embodiment, the negative photoresist material is applied to be the photoresist material for the color resist layer, so the exposed area is the part of the color resist to be remained on the substrate. The substrate is irradiated by ultraviolet light 40 through the mask 30 having the predetermined pattern. The mask 30 has a pattern part 31 which is transparent, and a non-pattern part 32 which is non-transparent, so that the part to be formed with the predetermined pattern is exposed to form the exposed color resist layers 212, 222 and 232, and the unexposed color resist layers 211, 221 and 231 at the same time. The negative photoresist is applied in present embodiment, so the unexposed color resist layers 211, 221 and 231 are dissolved by developer to be removed latter; in contrast, when the positive photoresist material is applied, the predetermined pattern of the mask 30 must be reversed and the exposed color resist layer is dissolved by the developer to be removed. The aforesaid technical feature is a well-known technology in the art, so the detailed description is omitted.

Figure 3F:
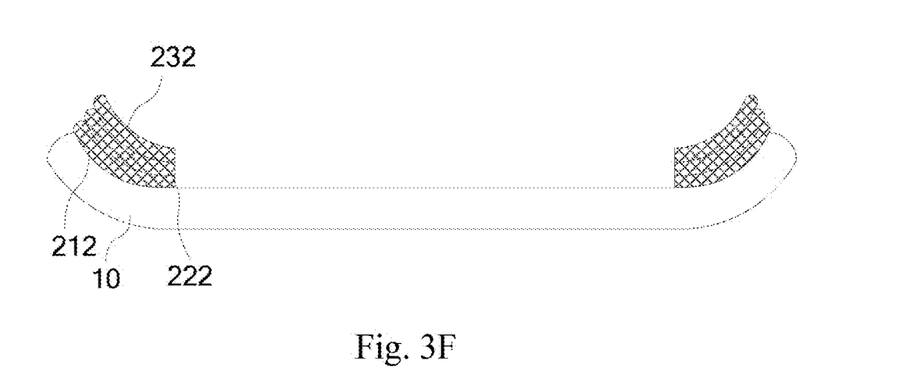

In a step 107: the non-pattern part of the color resist composite layer is removed, so that a color resist pattern is formed. This step is aforesaid development step, that is, the developer is formulated for the photoresist material of the color resist. The unexposed color resist layers 211, 221 and 231 are processed by the developer to be removed. The exposure process and removal process are parts of the lithography process which is a well-known technology of semiconductor process, so their detailed descriptions are omitted. After these two processes are completed, the predetermined pattern of the present disclosure can be obtained. After this step, the unexposed color resist layers 211, 221 and 231 are removed and only the exposed color resist layers 212, 222 and 232 are remained, as shown in FIG. 3F.

In a step 109, the color resist composite layer is cured. In this embodiment, the low-temperature baking method is used to cure the predetermined pattern by a temperature ranged from 100° C. to 180° C. The baking time of the baking process is adjusted upon actual situation, for example, upon properties, thickness or desired hardness of the cured color resist layer. The hardness of the cured color resist layer is ranged from 2H to 4H.

Figure 3G:
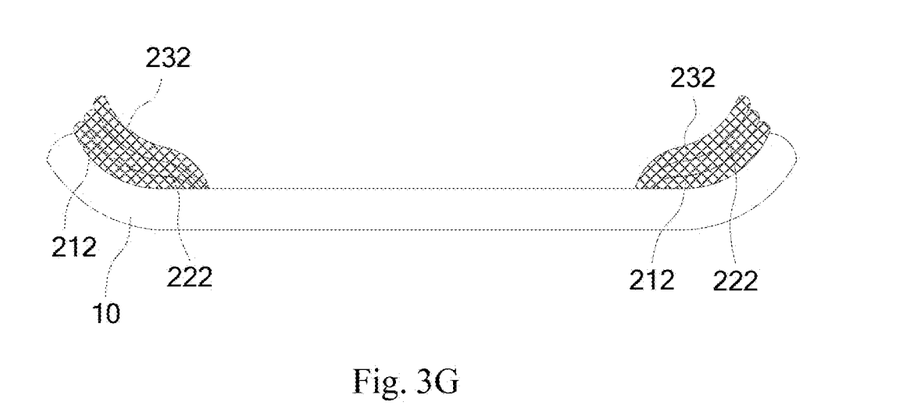

During the baking process of the step 109, because of the multilayer structure of the color resist layer applied in the present disclosure, the color resists may be flowable during the baking process to form a special ramp structure, so that the topmost color resist may contact the substrate. As shown in FIG. 3G, the color resist layers 212, 222 and 232 of the pattern part form the ramp structure due to the flowability occurred during the baking process, so that the color resist layers 212, 222 and 232 all contact the substrate 10. The multilayer of the color resist layer is applied in the present disclosure, so the special structure is formed by just the exposure and the baking process once, and such process of forming the ramp structure is a second feature of the present disclosure.

The first feature of the present disclosure is that the desired pattern can be generated by just performing the exposure process and removal process on the multilayer of the color resist composite layer, so as to significantly reduce the production time and cost. In addition, the photolithography applied in the present disclosure can also improve the resolution of the pattern.

Figure 1B:
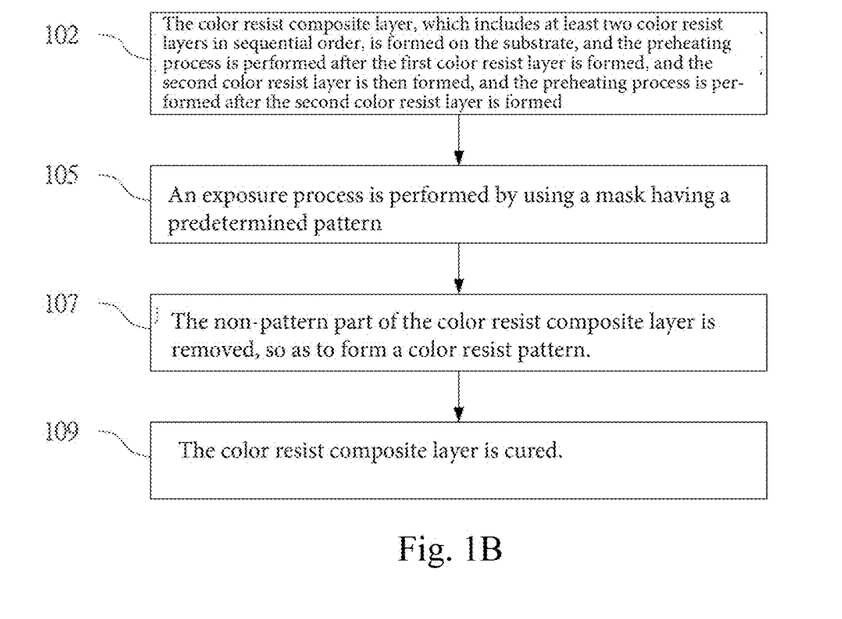
FIG. 1B is a flowchart of other embodiment of method for manufacturing color resist pattern of the present disclosure.

Please refer to FIG. 1B which shows a flowchart of other embodiment of method for manufacturing the color resist pattern of the present disclosure. According to steps shown in FIG. 1B, the cell-phone substrate shown in FIG. 2 can be manufactured. Compared with the embodiment shown in FIG. 1A, difference between present embodiment and the previous embodiment is that present embodiment further includes a step 102 of forming the color resist composite layer, which includes at least two color resist layers in sequential order, on the substrate, and performing the preheating process after the first color resist layer is formed, and then forming the second color resist layer, and performing the preheating process after the second color resist layer is formed, and so forth. This step can reduce the flowability of the color resist composite layer after each color resist layer is formed, so as to improve the uniformity the color resist composite layer without being deformed easily. As a result, the color resist layers have interfaces obviously separated from each other.

The embodiment shown in FIG. 1A includes the preheating process, and the embodiment shown in FIG. 1B includes multiple preheating processes. These two embodiments have different effects for meeting demands of various clients, so both are embraced in the present disclosure.

Please refer to FIGS. 4A to 4G which respectively show sectional views taken along line A-A of FIG. 2. The exemplary embodiment shown in FIGS. 4A to 4G illustrates the steps for manufacturing the substrate 10 of the cell phone having the pattern shown in FIG. 2. The planar substrate is taken as an example for explaining the method for manufacturing the color resist pattern of the present disclosure, and illustrating the special technology that the composite resist layer formed by the multiple resist layers is applied in the present disclosure and the exposure process is performed once. In addition, in this embodiment a contact mask 30-1 is used to manufacture the desired pattern shown in FIG. 2, and the positive photoresist is applied as material of the color resist composite layer.

Figure 4A:
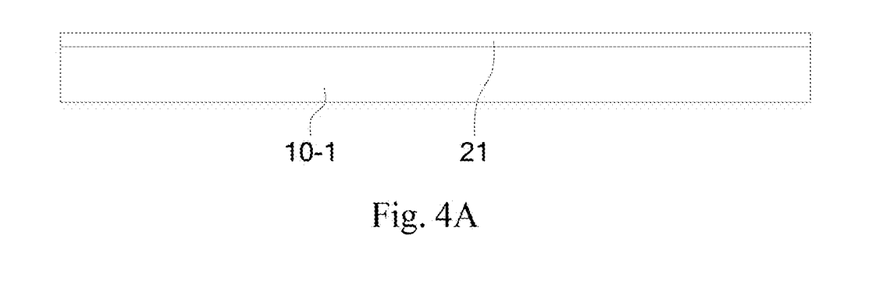
FIGS. 4A to 4G are schematic views of flows of other particular embodiment of the method for manufacturing the color resist pattern of the present disclosure.
Figure 4B:
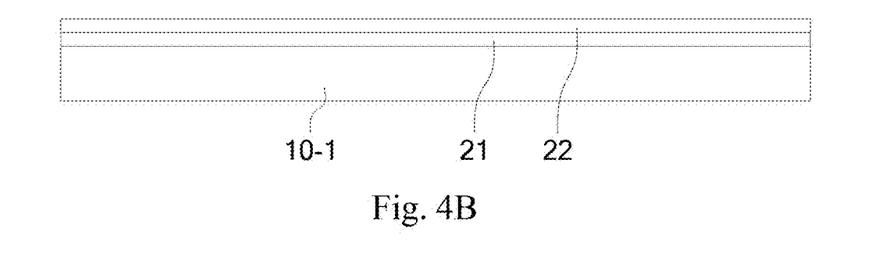
Figure 4C:
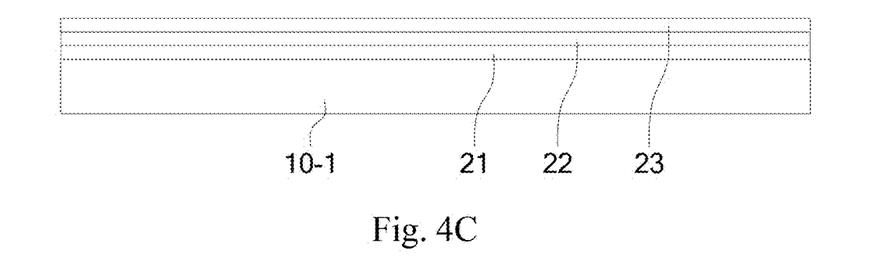
Figure 4D:
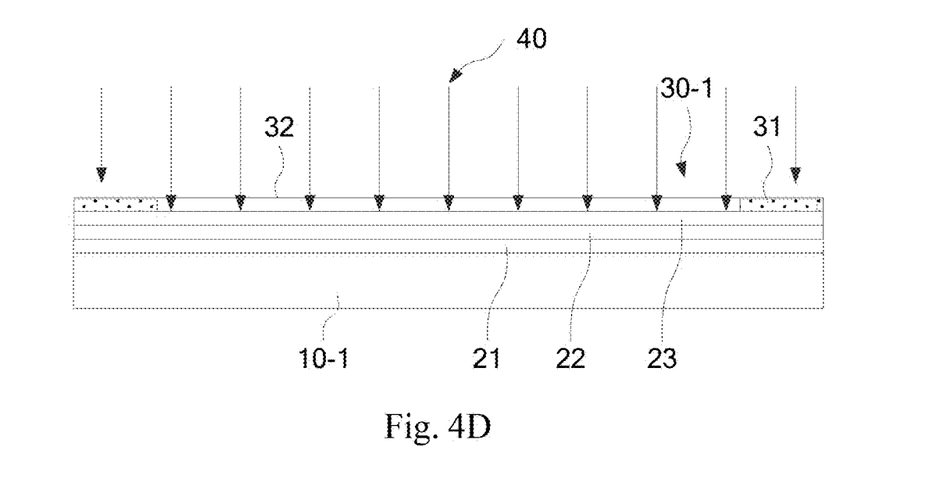
Figure 4E:
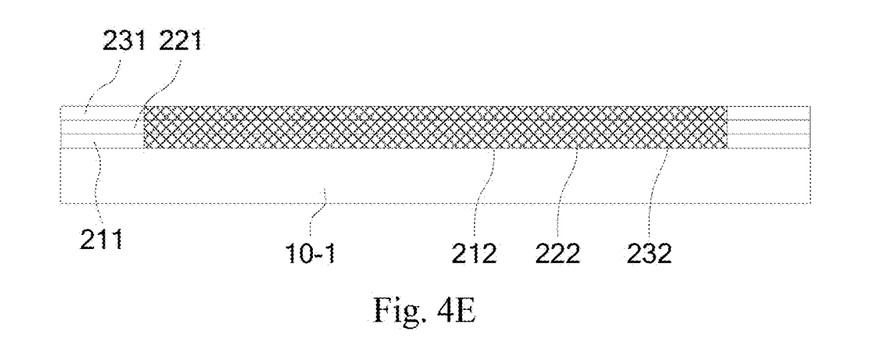
Figure 4F:
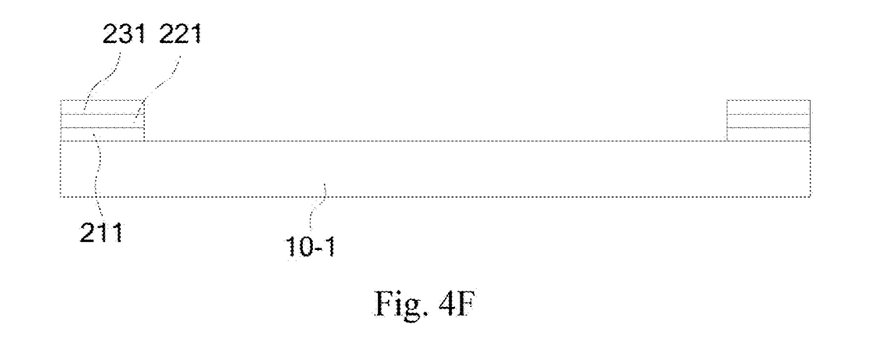
Figure 4G:
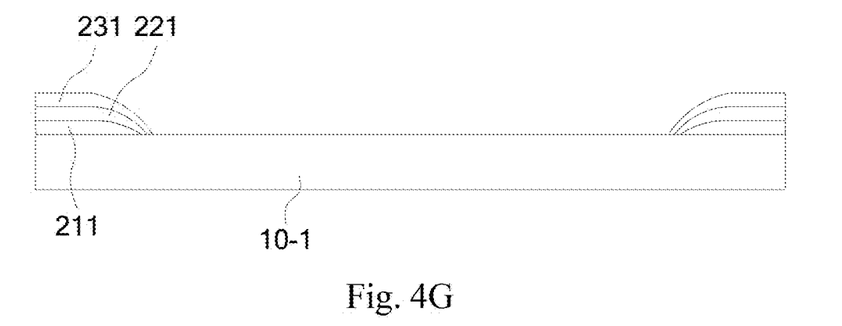

Please refer to FIGS. 4D to 4G. Because of applying the positive photoresist, the pattern of the contact mask 30-1 is completely opposite to that shown in FIG. 3D, that is, the exposed color resist layers 212, 222 and 232 are located at the middle area, and the unexposed color resist layers 211, 221 and 231 are located at the edge area. After being processed by developer, the exposed color resist layers 212, 222 and 232 located at the middle area are removed by the development process, and the unexposed color resist layers 211, 221 and 231 are remained. Similarly, after the baking process is completed, the unexposed color resist layers 211, 221 and 231 form the ramp structure, as shown in FIG. 4G.

Figure 5:
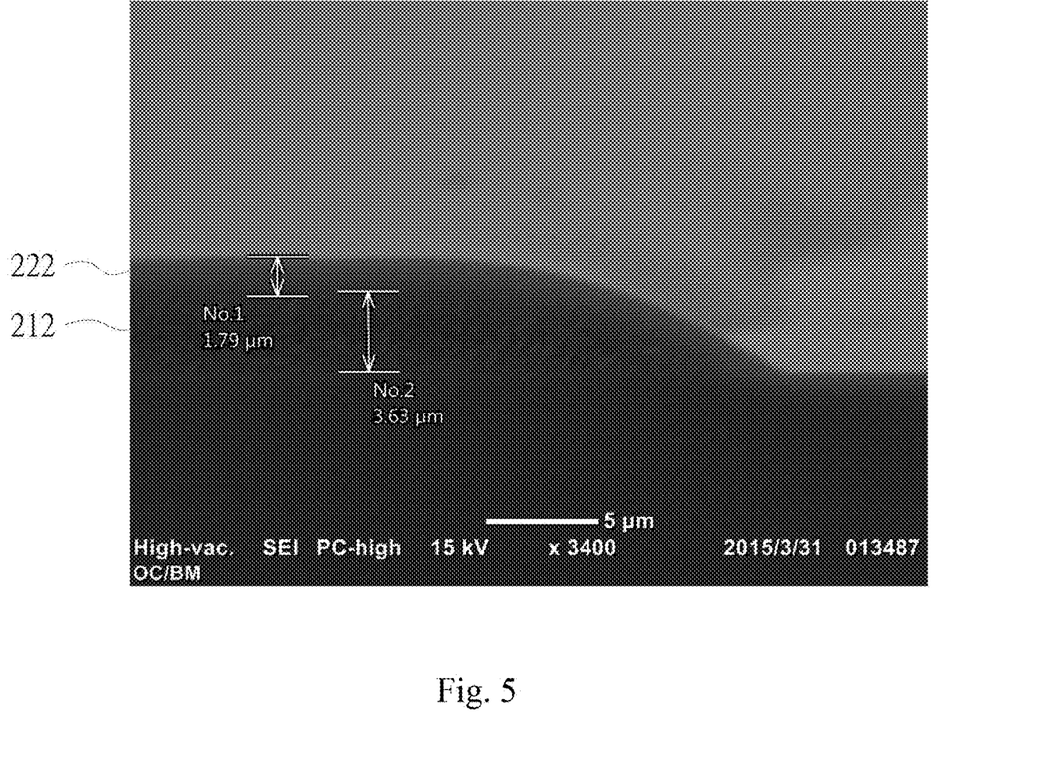
FIG. 5 is sectional view of a scanning electron micrograph of the color resist pattern of the present disclosure.

Please refer to FIG. 5 which shows a sectional view of a scanning electron micrograph of the color resist pattern of the present disclosure. It is obvious that edge parts of the exposed color resist layers 212 and 222 obviously form the ramp; furthermore, thicknesses of the exposed color resist layers 212 and 222 are 3.63 micron and 1.79 micron respectively, so that the required photoresist material can be reduced significantly and the cost in material is decreased. This is the third feature of the present disclosure.

According to the present disclosure, the method of forming the color resist pattern can be applied to manufacture a device with color resist pattern, and the device includes: a substrate; at least two color resist layers formed on the substrate. Both of the at least two color resist layers construct a visible pattern together, that is, the pattern formed by the least two color resist layers has visible appearance. By manner of applying the photolithography process, the pattern of the present disclosure has high resolution and uses less material. In addition, at the boundary of the pattern, the at least two color resist layers (that is, the color resist composite layer) form the ramp structure and each contacts the substrate.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A device having a color resist pattern, comprising:
a substrate; and
at least two color resist layers formed on a concavely curved surface of the substrate, constructing a visible pattern together;
wherein at a boundary of the color resist pattern, each and every color resist layer directly contacts the substrate,
wherein the boundary of the color resist pattern contacts a flat surface of the substrate,
wherein the at least two color resist layers are stacked on top of each other on the substrate,
wherein the substrate is a ceramic substrate.

2. The device according to claim 1, wherein a thickness of each of the at least two color resist layers is ranged from 0.5 micron to 30 micron.

3. The device according to claim 1, wherein a linewidth of the color resist pattern is greater than 10 microns.

4. The device of claim 1, wherein the at least two color resist layers further comprises a topmost layer disposed on the at least two color resist layers and wherein the topmost layer is a transparent resist layer.

5. The device according to claim 1, wherein a hardness of each of the at least two cured color resist layers is ranged from 2H to 4H.

6. The device according to claim 1, comprising two color resist layers, wherein thicknesses of the two color resist layers are 3.63 micron and 1.79 micron respectively.

* * * * *